United States Patent [19]
Morishige

[11] Patent Number: 5,343,271
[45] Date of Patent: Aug. 30, 1994

[54] EXPOSURE APPARATUS FOR DRAWING PATTERNS ON SUBSTRATES

[75] Inventor: Yukio Morishige, Tokyo, Japan

[73] Assignee: NEC Corporation, Japan

[21] Appl. No.: 96,725

[22] Filed: Jul. 23, 1993

[30] Foreign Application Priority Data

Jul. 28, 1992 [JP] Japan .................................. 4-200726

[51] Int. Cl.⁵ ............................................. G03B 27/42
[52] U.S. Cl. ...................................... 355/53; 355/46; 355/70
[58] Field of Search ............................. 355/46, 53, 70

[56] References Cited

U.S. PATENT DOCUMENTS

| | | | |
|---|---|---|---|
| 4,541,712 | 9/1985 | Whitney | 355/53 |
| 5,091,744 | 2/1992 | Omata | 355/53 |

FOREIGN PATENT DOCUMENTS 62-26819 4/1987 Japan .

Primary Examiner—Richard A. Wintercorn
Attorney, Agent, or Firm—Laff, Whitesel, Conte & Saret

[57] ABSTRACT

The invention is an exposure apparatus for directly drawing a pattern on a photoresist layer on a substrate. The apparatus has a movable stage on which the substrate is placed, an array of a plurality of semiconductor lasers held above the movable stage, laminated arrays of optical elements to project a suitably shaped laser beam spot on the substrate from each semiconductor laser and control means for exciting and deexciting the semiconductor lasers each individually while moving the stage such that the substrate passes under the array of semiconductor lasers. The primary merit of this apparatus is a great reduction in the time taken to accomplish exposure of a very large-sized substrate such as, e.g., a substrate of a flat-panel display for a high-definition television set.

8 Claims, 4 Drawing Sheets

LASER LIGHT

EXPOSURE APPARATUS FOR DRAWING PATTERNS ON SUBSTRATES

BACKGROUND OF THE INVENTION

This invention relates to an exposure apparatus for directly drawing a pattern on a photoresist layer on a substrate. The exposure apparatus uses a plurality of semiconductor lasers as light sources and is applicable to large-sized substrates.

In the conventional lithographic processes for the fabrication of semiconductor devices, it is usual to transfer a mask pattern to a substrate by a projection method for the sake of increased yield of acceptable products and enhanced throughput of exposure apparatus. In the projection method, as the consequence of a trade-off between the resolution of the transferred pattern and the size of an area exposed in each exposure operation, it is prevailing to employ a step-and-repeat technique with an apparatus called a stepper which accomplishes exposure of the entire area of the substrate by repeating the sequence of making an exposure on a limited area of the substrate, then moving the substrate a predetermined distance and making another exposure.

When the step-and-repeat technique is applied to large-sized substrates there arises a problem that the total exposure time greatly increases since the number of repetition of exposure increases in proportion to the square of the diagonal length of the substrate. For example, in the case of forming a regular pattern on a substrate for a liquid crystal display panel of approximately A4 size by using a currently prevailing stepper the total exposure time is about 5 min. If the same step-and-repeat exposure method is employed for the fabrication of a 40-inch display panel which will find a large market in near future, the total exposure time exceeds 50 min which is quite beyond tolerance in commercial fabrication. Besides, with an increase in the substrate size greater difficulties arise in quickly and accurately moving the table or stage carrying the substrate to perform the step-and-repeat process because of an increase in the inertial force acting on the stage.

It is possible to make an exposure on a widened area by using a large aperture lens for mask pattern projection. However, the resolution of the obtained pattern becomes worse, and the exposure apparatus becomes very costly because of great difficulties in the manufacture of the lens.

Another method, which is under development, for pattern fabrication is a direct writing method using a focused energy beam such as electron beam or laser beam to draw a pattern of lines with strokes of the beam spot on a substrate having a photoresist layer. By this method the drawing of a pattern on the substrate is made directly from pattern data in the form of CAD data without using any photographic mask. Therefore, there is a good prospect of practical use of this method, for example, in the fabrication of wiring patterns of application-specified LSIs for which a reduction in development hours is a matter of importance. As to the use of a laser beam in the direct writing method, for example, JP 62-26819 A shows an apparatus for drawing a pattern by splitting an argon laser beam into several beams and controlling the projection of each of the splitted beams with an acoustic-optic modulator. Besides, there is a proposal of using a semiconductor laser as the light source in a direct writing apparatus.

However, there are several problems in the application of the direct writing method to large-sized substrates. First, the total exposure time increases in proportion to the surface area of the substrate because it is usual to make exposure with a projection system comprised of a light source and an objective lens. Besides, this method is inferior to the conventional step-and-repeat method in exposure area per unit time. Therefore, in the case of a large-sized substrate the total exposure time becomes very long so that the throughput of the exposure apparatus becomes insufficient. Furthermore, known exposure apparatus for the direct writing method are complicated and costly mainly because of using deflection scanning optics for the purpose of high speed patterning.

SUMMARY OF THE INVENTION

It is an object of the present invention to provide an exposure apparatus for directly drawing a pattern on a photoresist layer on a substrate, which can accomplish exposure of a wide area in a short time and hence is advantageously applicable to very large-sized substrates such as, for example, flat panel display substrates for future high-definition television (HDTV) sets.

The invention provides an exposure apparatus for directly drawing a pattern on a photoresist layer on a substrate, which comprises a movable stage on which the substrate is placed, a laser array unit which comprises an array of a plurality of semiconductor lasers and is held above the movable stage such that the substrate passes under the laser array unit when the stage is horizontally moved in a predetermined direction, optical means for shaping a laser light beam emitted from each of the semiconductor lasers and projecting a beam spot of a predetermined shape on the substrate on the movable stage from each semiconductor laser, stage control means for controlling the movement of the stage in the predetermined direction, laser control means for exciting and deexciting each of the semiconductor lasers independently of the others, and primary control means for synchronously operating the stage control means and the laser control means on the basis of prescribed exposure pattern data.

As stated above, an exposure apparatus according to the invention uses a plurality of semiconductor lasers which are arranged so as to make an array and can be excited and deexcited each individually. For each of the semiconductor lasers there is a combination of optical elements such as a combination of a collimator lens, a beam-shaping slit and an image-forming lens for the purpose of projecting a laser light beam spot of a predetermined shape on the substrate on the movable stage. In this apparatus it is unnecessary to deflect the laser light beams. The light beam emitted from every semiconductor laser is projected straightly downward and draws a line on the substrate while the substrate is moving so as to pass under the array of semiconductor lasers. With this apparatus, the entire area of the substrate can be scanned by moving the substrate either in the lengthwise direction or in the widthwise direction.

An exposure apparatus according to the invention is particularly suited to the fabrication of a regular, grid-like pattern on a large-sized substrate for a flat-panel display such as a liquid crystal panel. To draw such a grid-like pattern, the repeating intervals of the arrayed semiconductor lasers, viewing from the direction of the movement of the substrate, are made equal to the repeating intervals of parallel lines of the pattern, and the width of the beam spot projected from each semiconductor laser is made equal to the line width of the pattern. Then, the grid-like pattern can be drawn by scanning the substrate twice, first in X-direction and next in Y-direction normal to the X-direction. Therefore, it is possible to greatly reduce the total exposure time needed to draw the whole pattern.

For example, it is possible to draw 1024 lines (equal to the number of scanning lines of a HDTV) of a wiring pattern on a diagonally 1 m long substrate in only 1 sec by using an array of 1024 semiconductor lasers and moving the substrate at a speed of 1 m/sec.

With an apparatus according to the invention, an enlargement of the exposure area of substrate can be coped with by increasing the number of semiconductor lasers, and an increase in the total exposure time is nearly proportional to the length of one side of the substrate. This is a very important merit of the invention in view of the fact that with conventional exposure apparatus the total exposure time is proportional to the square of the length of substrate.

In the present invention semiconductor lasers are used as the light sources because semiconductor lasers are high in reliability, sufficiently small in size (i.e. not very larger than the line spacings of patterns to be drawn) and easy to switch on and off. Together with a number of semiconductor lasers, an apparatus according to the invention uses a large number of optical elements such as lenses and slits for shaping and projecting laser light beams, and these optical elements are arranged in an arrayed structure. In the practice of the invention it is necessary to mass-produce the arrayed structure of the optical elements with high precision. It is practicable to accomplish the desired mass-production by the application of the microoptics process techniques already developed for the manufacture of optical disks and optical communication devices. In using the microoptics process techniques, it is possible to reduce the production cost and enhance both productivity and accuracy by dividing a desired arrayed structure of the optical elements into a number of sub-units each of which contains tens of sets of the optical elements.

In a preferred embodiment of the invention, the exposure apparatus includes a plurality of photoelectric sensors which are arranged so as to detect a failure or malfunction of any of the semiconductor lasers, and the laser control means can immediately deexcite the failed or malfunctioned semiconductor laser while the exposure operation is continued with the remaining semiconductor lasers. In such a case there is a blank in the pattern drawn on the substrate. To fill up the blank in the pattern by a supplemental exposure with the same apparatus, the primary control means memorizes the position of the laser beam spot from the failed or malfunctioned semiconductor laser at the moment of detection of the failure or malfunction and generates supplemental exposure pattern data. For the purpose of easily replacing the failed or malfunctioned semiconductor laser, it is preferred to make the laser array unit as an assembly of a plurality of replaceable segments each of which has a relatively small number of semiconductor lasers.

DESCRIPTION OF THE PREFERRED EMBODIMENTS

Figure 1:
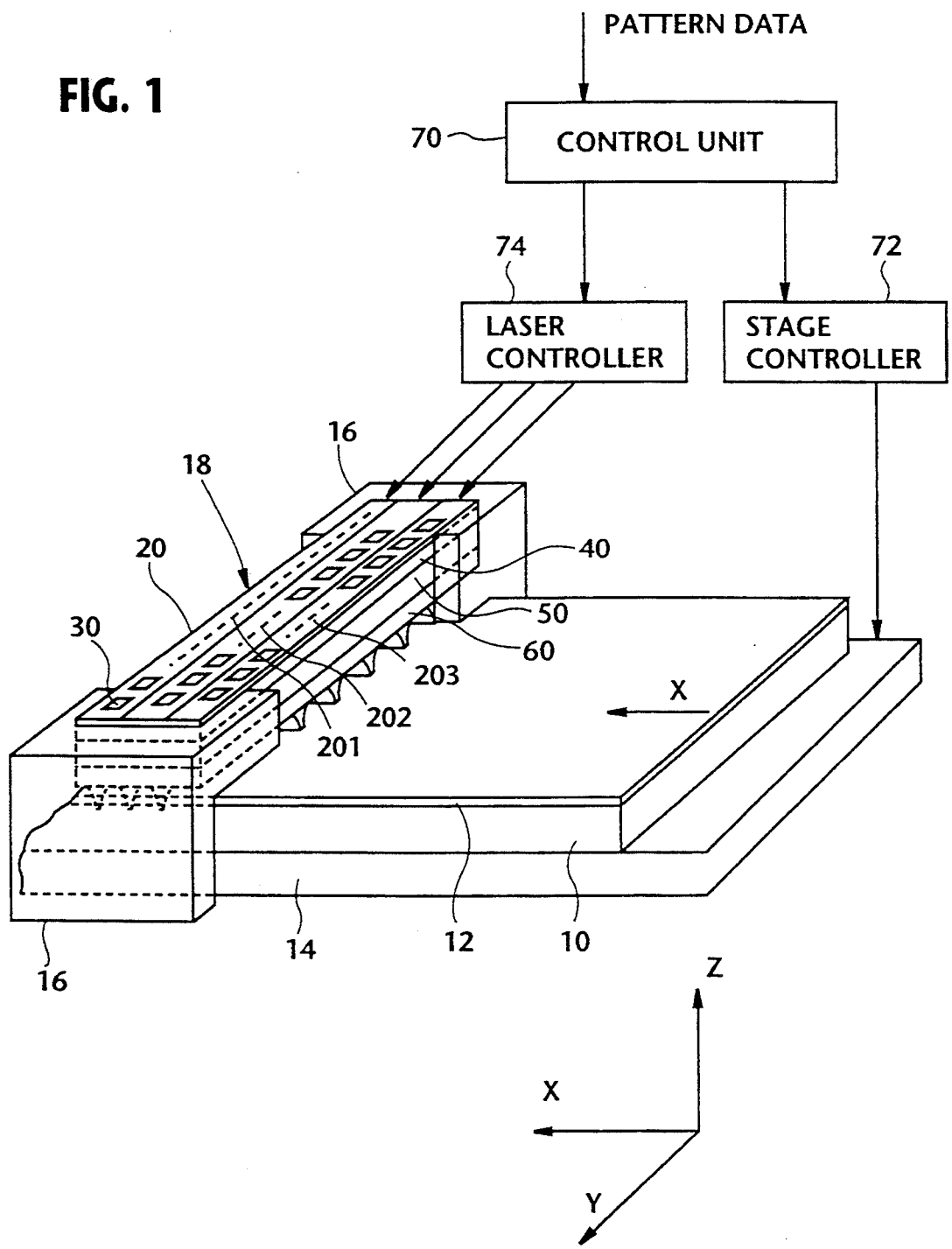
FIG. 1 is a schematic illustration of an exposure apparatus which is an embodiment of the invention.

FIG. 1 shows an embodiment of the invention. The exposure apparatus of FIG. 1 is useful for drawing a regular pattern on a rectangular substrate 10 which is to be processed into a thin-film transistor (TFT) substrate of a liquid crystal display panel for a 40-inch class HDTV set. The top surface of the substrate 10 is laid with a photoresist layer 12.

In the exposure apparatus the substrate 10 is placed on a conventional X-Y-Z stage 14, which can be moved in a horizontal X-direction a distance sufficient for scanning the substrate 10 from its one end to the opposite end and also can be moved in Y- and Z-directions to some extents in order to precisely adjust the initial position and height of the substrate 10.

The principal component of the exposure apparatus is a light beam projecting system 18 which is held stationary above the substrate 10 on the X-Y-Z stage 14 by support mechanisms 16. The light beam projecting system 18 is a laminated assembly of a semiconductor laser array unit 20 which is the top layer, a collimator lens array unit 40 (the second layer), a slit array unit 50 (the third layer) and an image-forming lens array unit 60 which is the bottom layer. As a whole, the light beam projecting system 18 is horizontally elongate in the direction normal to the X-direction. The semiconductor laser array unit 20 has an array of a number of semiconductor lasers 30. Both the collimator lens array unit 40 and the image-forming lens array unit 60 have an array of plate lenses formed on a glass substrate such that each of the arrayed semiconductor lasers 30 is provided with a collimator lens and an image-forming lens. The slit array unit 50 is formed by using a light shielding film of chromium formed on the bottom side of the glass substrate of the collimator lens array unit 40 so as to provide a beam-shaping aperture to each of the semiconductor lasers 30. In this embodiment, for example, the pattern to be drawn on the substrate 10 consists of lines having a constant width of 30 μm. Accordingly the laser light beam from every semiconductor laser 30 is shaped so as to project a rectangular spot 30 μm wide (and 30 μm in length in this example) on the substrate 10.

In this embodiment the semiconductor laser array unit 20 consists of three elongate rectangular sub-units 201, 202 and 203 in each of which 350 semiconductor lasers 30 are disposed in a straight row at regular intervals. The three sub-units 201, 202, 203 are arranged in parallel to constitute the array unit 20 in which the semiconductor lasers 30 are arranged in three rows. In the unit 20 the total number of the semiconductor lasers 30 is 1050. Similarly, each of the collimator lens array unit 40, slit array unit 50 and the image-forming lens array unit 60 is divided into three elongate sub-units.

The exposure apparatus includes a stage controller 72 which controls the movement of the X-Y-Z stage 14, a laser controller 74 which excites and deexcites the semiconductor lasers 30 in the apparatus each individually and a primary control unit 70 which provides control signals to both the stage controller 72 and the laser controller 74 in order to selectively excite the individual semiconductors 30 in synchronism with the movement of the X-Y-Z stage 14 in the X-direction. That is, each of the semiconductor lasers 30 in the array unit 20 can be excited independently of the others at a desired moment and for a desired period of time. In the control unit 70 the aforementioned control signals are generated by conversion of inputted exposure pattern data. The laser controller 74 performs an additional function, which is detecting a failure or malfunction of any of the semiconductor lasers 30, as will be described hereinafter.

Figure 2:
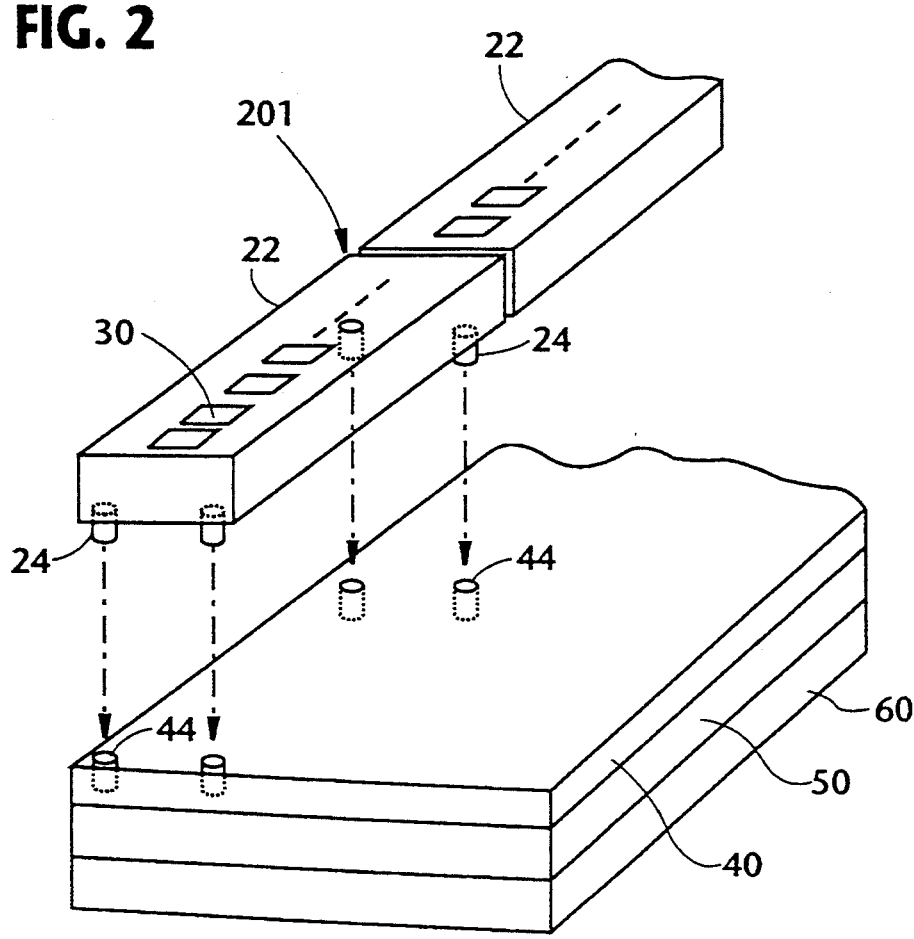
FIG. 2 is a schematic illustration of the manner of replaceably fitting a sub-unit of a semiconductor laser array unit in the apparatus of FIG. 1 into the optical system of the apparatus.

Referring to FIG. 2, each of the three sub-units 201, 202, 203 of the semiconductor laser array unit 20 is divided into a number of segments 22 each of which has a relatively small number of (e.g. 10) semiconductor lasers 30 in a straight row. On the bottom side of each segment 22 there are small cylindrical projections 24 which fit into holes 44 in the top surface of the collimator lens array unit 40. These projections 22 and holes 44 are used to replaceably mount the segments 22 on the collimator lens array unit 40. For sufficient accuracy of alignment it is suitable to provide each segment 22 with four diagonally arranged projections 22. For example, each projection 22 is 10 μm in diameter and 5 μm in length. In case of a failure or abnormal function of any of the semiconductor lasers 30 in the array unit 20, the segment 22 containing the defective semiconductor laser can easily and quickly be replaced by a new segment 22 without need of long interrupting the operation of the exposure apparatus and without significantly lowering the throughput of the apparatus.

Figure 3:
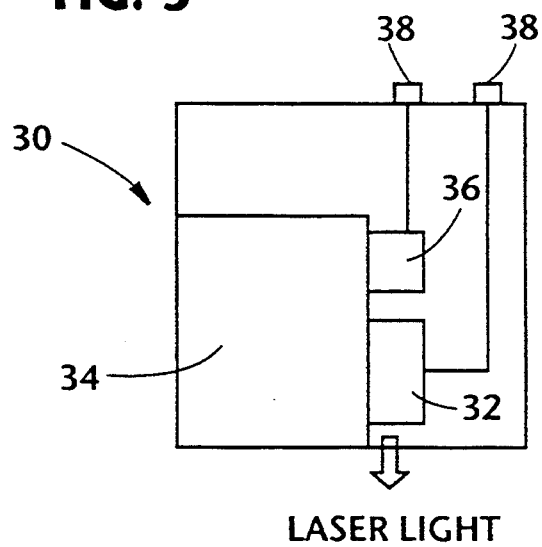
FIG. 3 is a diagrammatic illustration of a semiconductor laser package used in an apparatus according to the invention.

Each of the semiconductor lasers 30 in the apparatus of FIG. 1 is packaged as shown in FIG. 3. In the package a semiconductor laser chip 32 is mounted on a heat sink 34 such that the principal direction of laser light emission becomes vertically downward. On the opposite side, i.e. above the semiconductor laser chip 32, there is a photodiode 36 to monitor the intensity of emitted laser light and detect a failure or abnormal function of the semiconductor laser 32. Using terminals 38 the semiconductor laser chip 32 and the photodiode 36 are connected to the laser controller 74 in FIG. 1.

Figure 4:
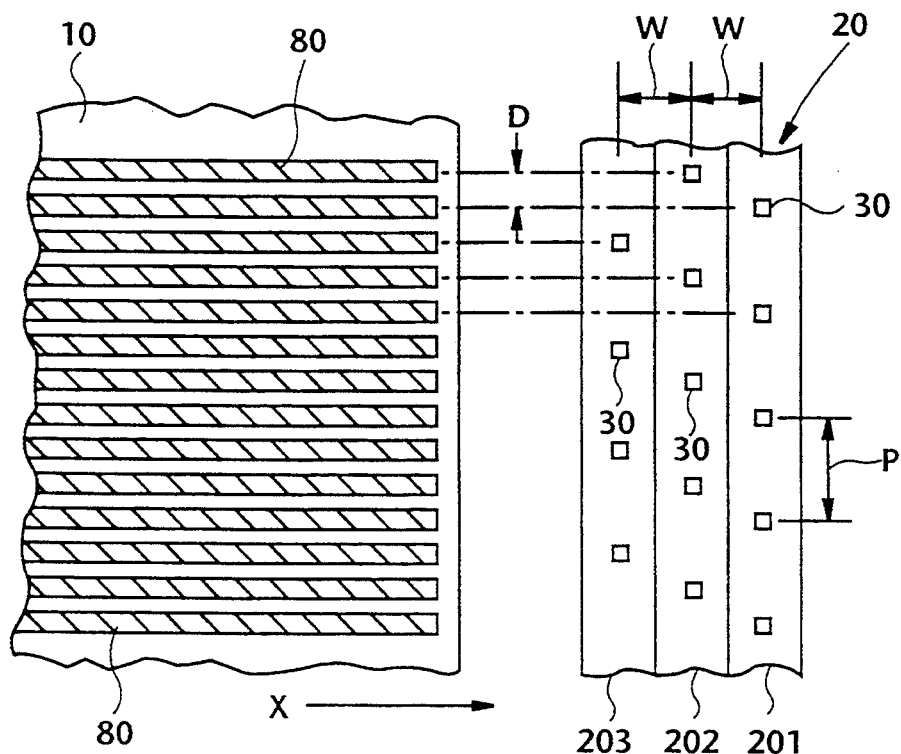
FIG. 4 is a schematic and fragmentary illustration, in a plan view, of an arrangement of semiconductor lasers in the apparatus of FIG. 1 and an exposure pattern which can be formed on a substrate by using this arrangement of semiconductor lasers.

Referring to FIG. 4, the pattern to be drawn on the substrate 10 has a number of parallel lines 80 which extend in the X-direction. Every line 80 has a width of 30 μm and at a distance D of 0.5 mm from the adjacent line. In any of the three sub-units 201, 202, 203 of the semiconductor laser array unit 20 the pitch P of the regularly spaced semiconductor lasers 30 is 1.5 mm, which is three times the aforementioned distance D. However, there is a discrepancy between the arrangement of the semiconductor lasers 30 in the sub-unit 201 and that in the next sub-unit 202. In the direction (Y-direction) normal to the X-direction, there is a 0.5 mm difference between the position of each semiconductor laser 30 in the sub-unit 202 and that in the sub-unit 201. In the next sub-unit 203 the position of each semiconductor laser 30 is shifted in the same direction by another 0.5 mm. Therefore, viewing from the X-direction, each semiconductor laser 30 in the array unit 20 does not overlap any of the other semiconductor lasers 30, and all the semiconductor lasers 30 in the array unit 20 are at regular intervals of 0.5 mm in conformity with the intervals D of the parallel lines 80 of the aimed pattern. In the X-direction, the center-to-center distance W between the sub-unit 202 and the adjacent sub-units 201 or 203 is, for example, 2 mm.

Thus, FIG. 4 illustrates to arrange the semiconductor lasers 30 in the array unit 20 in a plurality of rows which are appropriately staggered with respect to each other. By the employment of such arrangement it is possible to form a pattern with line spacings (D) narrower than the width of each semiconductor laser 30.

Figure 5:
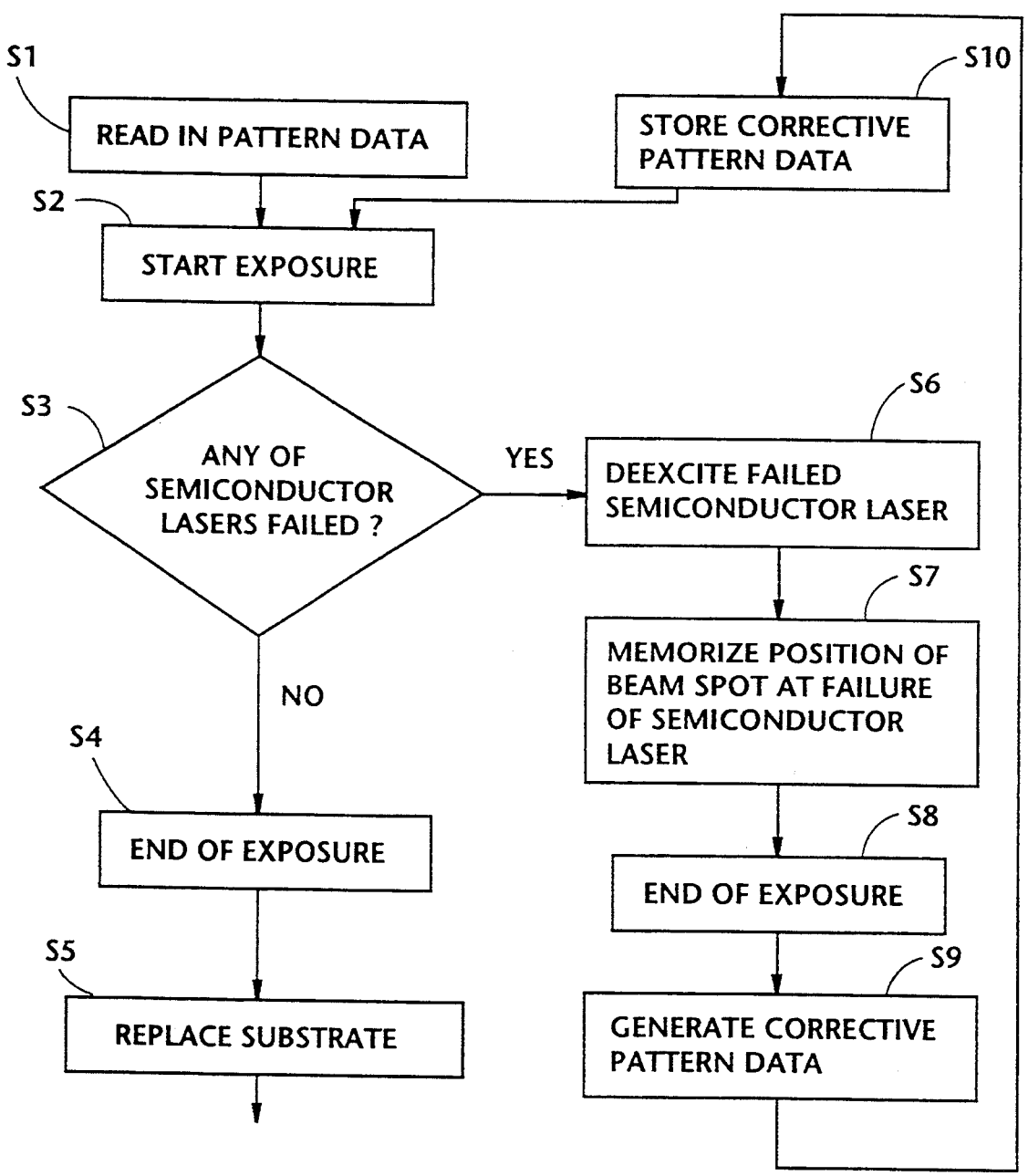
FIG. 5 is flow chart showing the operation of an apparatus according to the invention.

FIG. 5 is a flow chart showing the operation of the above described exposure apparatus.

At the initial step $S_1$ the control unit 70 reads in the exposure pattern data and generates control data for controlling the stage controller 72 and the laser controller 74, and stores the generated control data.

The next step $S_2$ is projecting shaped laser beams on the photoresist layer 12 on the substrate 10 while the X-Y-Z stage 14 carrying the substrate 10 is moving in the X-direction. Preparatory to the exposure operation, the position of the stage 14 in the Z-direction is adjusted so as to keep the substrate 10 at an optimum height for the exposure operation, and the position of the stage 14 in the Y-direction is adjusted according to the boundaries of the area for forming the pattern. After that the stage 14 is moved in the X-direction. The stage 14 is moved at a predetermined constant speed after one end of the substrate 10 reaches a line beneath an edge of the light projecting system 18. While the stage 14 is carrying the substrate 10 further in the X-direction, the semiconductor lasers 30 in the array unit 20 are individually excited by the laser controller 74 to which the control unit 70 feeds the control signal produced on the basis of the exposure pattern data. In the case of drawing the parallel lines 30 shown in FIG. 4, nearly all the semiconductor lasers 30 of the apparatus are commanded to continuously emit laser light. The exposure comes to an end when the substrate 10 (stage 14) moves a predetermined distance in the X-direction. After that the substrate 10 is turned by 90 degrees and reset on the stage 14, and the above described exposure operation is repeated in order to draw additional pattern lines which extend in the direction normal to the X-direction. The end of this exposure operation is step $S_4$ in FIG. 5.

During the exposure step, the function of each semiconductor laser 30 (more particularly, the semiconductor laser chip 32 in FIG. 3) is monitored by the photodiode 36. The output of the photodiode 36 is fed to the controller 74, at step $S_3$ in FIG. 5, to check whether the semiconductor laser 30 is normally functioning or not. In case of the detection of a failure or abnormal function, such as lowering of light output, the semiconductor laser 30 in question is immediately turned off (step $S_6$). Simultaneously, at step $S_7$, the position of the beam spot on the substrate 10 from the defective semiconductor laser at the moment of detection of the failure or abnormal function is memorized in the control unit 70. Despite the insertion of these checking steps, the exposure operation is continued until the end of the movement of the substrate 10 in the X-direction at step $S_8$. After that the substrate 10 on the stage 14 is returned to the initial position. To fill up the blank in the exposure pattern attributed to the omission of the operation of the defective semiconductor laser, corrective exposure pattern data is generated and stored in the control unit 70 at steps $S_9$ and $S_{10}$. By using the corrective exposure pattern data a supplementary exposure is made in order to make exposure only in the area where the planned exposure was interrupted in the preceding exposure operation. In the supplementary exposure the direction of the movement of the substrate 10 is the same as in the preceding exposure. In advance of the supplementary exposure, the position of the substrate 10 is slightly shifted in the Y-direction in order to use a healthy semiconductor laser 30 in place of the defective one.

The inclusion of the above described monitoring and correcting steps has the merit of improving the yield of the exposure operation because even in case of an unpredictable failure or malfunction of any of the semiconductor lasers 30 the substrate 10 under exposure is not wasted. After the correcting exposure step the failed semiconductor laser can easily be replaced by a new one by replacing the segment 22 containing the failed semiconductor laser 30 by a new segment 22, as described hereinbefore.

The following is a description of an experiment with the apparatus of FIG. 1.

The semiconductor lasers 30 used in the experiment emitted visible light at wavelength of 630 nm, and the laser output power was 10 mW. The photoresist 12 on the substrate 10 was sensitive to visible light. The laser beam of every semiconductor laser was focused to a 30-$\mu$m square spot on the photoresist layer 12, and the irradiating intensity of the beam spot was 3 kW/cm$^2$. Under these exposure conditions, the photoresist layer 12 exhibited practically sufficient sensitivity so long as the speed of the horizontal movement of the substrate 10 was below about 2 m/sec. Therefore, in the experimental exposure operation the stage 14 carrying the substrate 10 was moved at a constant speed of 1 m/sec.

The substrate 10 had a diagonal length of about 1 m (about 40 in.). In the first exposure the substrate 10 was moved in the X-direction to produce the pattern shown in FIG. 4, consisting of the parallel lines 80. After that the substrate 10 was turned by 90 degrees, and the second exposure was made so as to form parallel lines crossing the lines 80 in FIG. 4. The length of time needed to complete the two exposure operations was about 1 min, including the alignment time. If the same pattern should be produced by the conventional stepper technique, it will take about 50 min to complete the exposure process.

In the embodiment illustrated in FIGS. 1 and 4 the semiconductor laser array unit 20 serves the purpose of drawing a pattern consisting of parallel lines with uniform line spacings. In the case of a pattern having a plurality of series of lines different in line spacings or a plurality of pattern components different in shape, an apparatus according to the invention may have a plurality of differently designed semiconductor laser array units in order to accomplish the exposure for the whole pattern during a single run of the substrate 10 in the X-direction.

Figure 6:
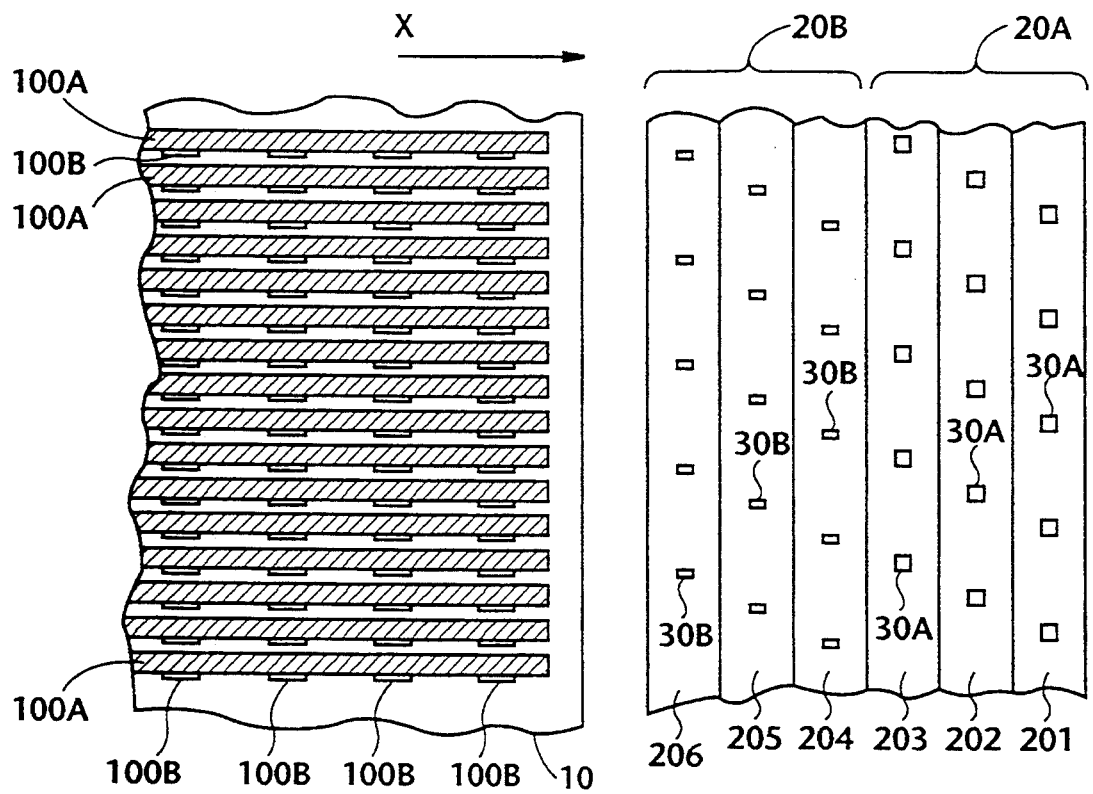
FIG. 6 is a schematic and partial illustration, in a plan view, of another arrangement of semiconductor lasers in an apparatus according to the invention and an exposure pattern which can be formed on a substrate by using this arrangement of semiconductor lasers.

FIG. 6 illustrates an exposure pattern consisting of straight parallel lines 100A and a number of thin and short strips 100B attached to the individual lines 100A and a combination of two semiconductor laser array units 20A and 20B used to draw the illustrated pattern. The first array unit 20A has three sub-units 201, 202, 203 in each of which semiconductor lasers 30A are arranged in a row at regular intervals. This array unit 20A is substantially identical with the array unit 20 shown in FIG. 4 and serves the purpose of drawing the parallel lines 100A of the aimed pattern. The second array unit 20B has three sub-units 204, 205, 206 in each of which semiconductor lasers 30B are arranged in a row at regular intervals so as to form the strips 100B. For each of the semiconductor lasers 30B the slit and the image-forming lens are designed so as to project an appropriately small beam spot on the substrate surface, and in the exposure operation each of the semiconductor lasers 30B is intermittently excited.

Thus, an apparatus according to the invention can be adapted to the scale of production or the restrictions on the equipment cost by suitably choosing the arrangement of semiconductor lasers or the number of semiconductor laser array units according to the aimed pattern and/or the required throughput.

What is claimed is:

1. An exposure apparatus for drawing a pattern on a photoresist layer on a substrate, comprising:
    a movable stage on which the substrate is placed;
    a laser array unit which is held above said movable stage such that the substrate passes under the laser array unit when said stage is horizontally moved in a predetermined direction and comprises an array of a plurality of semiconductor lasers;
    optical means for shaping a laser light beam emitted from each of said semiconductor laser and projecting a beam spot of a predetermined shape on the substrate on said table from each of said semiconductor lasers;
    stage control means for controlling the movement of said stage in said predetermined direction;
    laser control means for exciting and deexciting each of said semiconductor lasers independently of the others; and
    primary control means of synchronously operating said stage control means and said laser control means on the basis of prescribed exposure pattern data.

2. An exposure apparatus according to claim 1, further comprising a plurality of photoelectric sensors which are arranged so as to detect a failure or malfunction of any of said semiconductor lasers, said laser control means comprising means for immediately deexciting any of said semiconductor lasers when failure or malfunctions of the semiconductor laser is detected.

3. An exposure apparatus according to claim 2, wherein said primary control means comprises means for memorizing the position of the laser beam spot from the failed or malfunctioned semiconductor laser at the moment of detection of the failure of malfunction and generating supplemental exposure pattern data needed to remedy incompleteness of the pattern drawn on the substrate attributed to the deexcitation of the failed or malfunctioned semiconductor laser.

4. An exposure apparatus according to claim 2, wherein said laser array unit is an assembly of a plurality of replaceable segments each of which comprises a relatively small number of semiconductor lasers.

5. An exposure apparatus according to claim 1, wherein said laser array unit is an assembly of a plurality of sub-units which are elongate in the direction normal to said predetermined direction and arranged parallel to each other, each of said sub-units comprising a plurality of semiconductor lasers arranged in a straight row at regular intervals such that, viewing from said predetermined direction, the position of each of the semiconductor lasers in the laser array unit does not overlap the position of any of the other semiconductor lasers.

6. An exposure apparatus according to claim 5, wherein each of said sub-units is a combination of a plurality of linearly arranged relatively short segments each of which comprises a relatively small number of semiconductor lasers and is replaceable.

7. An exposure apparatus according to claim 6, wherein each of said segments has a plurality of pin-like projections, said optical means comprising a planar part which is formed with a plurality of holes in which said pin-like projections fit, respectively.

8. An exposure apparatus according to claim 1, wherein said optical means comprises, for each of said semiconductor lasers, a collimator lens positioned below the semiconductor laser, a beam-shaping slit positioned below the collimator lens and an image-forming lens positioned below the slit.

* * * * *